United States Patent [19]
Yamaguchi et al.

[11] Patent Number: 5,206,606
[45] Date of Patent: Apr. 27, 1993

[54] CONTROL CIRCUIT FOR SIGNAL LEVEL

[75] Inventors: Futao Yamaguchi, Kanagawa; Takeshi Ikeda; Osamu Yoshioka, both of Kagoshima, all of Japan

[73] Assignee: Sony Corporation, Tokyo, Japan

[21] Appl. No.: 860,991

[22] Filed: Mar. 31, 1992

[30] Foreign Application Priority Data

Mar. 31, 1991 [JP] Japan ................... 3-092937
Mar. 31, 1991 [JP] Japan ................... 3-092938

[51] Int. Cl.$^5$ .................... H03F 3/45; H04N 5/52
[52] U.S. Cl. ....................... 330/254; 358/176
[58] Field of Search ........... 330/252, 254, 256, 259; 358/174, 175, 176, 184

[56] References Cited

U.S. PATENT DOCUMENTS 4,658,297  4/1987  Nomura et al. .............. 358/176 X

FOREIGN PATENT DOCUMENTS 0033420  3/1977  Japan ....................... 358/176

Primary Examiner—Steven Mottola
Attorney, Agent, or Firm—Hill, Steadman & Simpson

[57] ABSTRACT

In a signal level control circuit a gain of a current obtained by converting an input signal is controlled by an external control signal in order to automatically control the level of the input signal. The potential of a resistor with a temperature characteristic is set by a voltage determined by the product of an external reference current and an internal resistance so that the temperature characteristic of a current output through the resistor with the temperature characteristic can be removed.

3 Claims, 8 Drawing Sheets

CONTROL CIRCUIT FOR SIGNAL LEVEL

BACKGROUND OF THE INVENTION

This invention relates to a control circuit for signal level, and is more particularly suitably applicable to the case wherein a sync tip level and deviation of a luminance signal is automatically controlled.

Conventionally, in a video tape recorder, the luminance signal component of an image signal is subjected to a frequency modulation (hereinafter, referred to as an FM modulation), in accordance with the output characteristics of a reproduction head, and recorded on a magnetic tape.

In this FM modulation system, the sync tip level of a luminance signal is modulated, for example, to 4.2 [MHz] and the white peak level thereof is modulated, for example, to 5.4 [MHz] (FIG. 1).

These sync tip level and white peak level are controlled by manually controlling a variable resistance of a carrier/deviation control circuit 1 shown in FIG. 2 in a manufactuaring line.

The carrier/deviation control circuit 1 is arranged such that the base of a PNP transistor Q1 is connected to the output terminal of an operational amplifier OP1 arranged as a voltage follower; the emitter thereof is connected to the inverted input terminal of the operational amplifier OP1, and the junction P1 at which the emitter is connected to the inverted input terminal is connected to a carrier control pin 1A.

The carrier control pin 1A is connected to a reference voltage supply pin 1B for supplying a second reference voltage V through a variable resistor R1, and a current supplied to an FM modulation circuit 2 through the transistor Q1 is controlled to a current I corresponding to a sync tip level by controlling a resistance between the junction P1 and the reference voltage supply pin 1B.

Further, an AC current i corresponding to a predetermined deviation is controlled by controlling a resistance of a variable resistor R2 connected between a deviation control pin 1C connected through an emphasis circuit 3 and an operational amplifier OP2 arranged as a voltage follower and the carrier control pin 1A.

A half H shift circuit 4 prevents crosstalk in such a manner that a half H shift current $I_H$ superimposed on the current I and AC current i at an $\frac{1}{2}$ horizontal frequency is supplied to the FM modulation circuit 2 to provide a difference in level with the sync tip level.

Neverthless, in the carrier/deviation control circuit 1, since the sync tip level and deviation is controlled by manually controlling the variable resistors R1 and R2, a problem arises in that trained workers are needed in a manufacturing line and the requirement for adjusting different controls on to a different type of carier/deviation control circuits is difficult to be met as a commodity cycle is shortened.

To cope with this problem, it is contemplated that an automatic control IC 6 composed of a voltage control amplifier 7, DCL/S circuit 8 and operational amplifier OP3 is additionally provided between the pins 1B and 1C of the carrier/deviation control circuit 1 to control a sync tip level and deviation, as shown in FIG. 3, but in this case the additional automatic control IC 6 is needed and thus a cost is increased, as well as a metal film resistor R3 is necessary between the automatic control IC 6 and the pin 1B.

Thus, as shown in FIG. 4, it is contemplated that this automatic control IC 6 is contained in the carrier/deviation control circuit 1, but in this case, although the additional IC is not necessary, the number of pins is increased from 2 to 4 and an external resistor R4 is necessary between the operational amplifier OP3 and the junction P1 to alleviate an influence due to the temperature characteristic of a resistance.

Furthermore, FIG. 5 shows the prior art wherein the control circuit uses automatic control circuit corresponding to EVR.

A carrier/deviation control circuit 11 controls a gain to an input signal $V_{in}$ by a DC control signal S1 input to a voltage amplifier 12, which has an output connected to the emitter of a transistor Q11 and the inverted input terminal of an operational amplifier OP11 composed of a voltage follower, through an internal resistor R1.

A first reference voltage (2V) is connected through an internal resistor R2 to the junction P1 at which the emitter of the transistor Q11 is connected to the inverted input terminal and thus a DC current I1 corresponding to a potential difference between a second reference voltage (V) supplied to the noninverted input terminal of the operational amplifier OP11 and the first reference voltage (2V) is supplied to an FM modulation circuit 3 through the transistor Q11.

The sync tip level of a luminance signal is set by the DC current I1.

The carrier/deviation control circuit 11 superimposes an AC current i flowing through the internal resistor R1 in accordance with a potential produced between the output voltage of the voltage control amplifier 12 and the junction P1 on the DC current I1 and supplies the same to the FM modulation circuit 13 to thereby control the sync tip level and deviation of the luminance signal.

Nevertheless, this carrier/deviation control circuit 11 has a problem that since a luminance signal Vin is converted once to a change of a voltage by the voltage control amplifier 12 and converted to an AC current i by the internal resistor R1 and then supplied to the FM modulation circuit 13, the voltage control amplifier 12 has a severe dynamic range, and thus an IC is difficult to be disigned only by lateral PNP transistors.

Further, although a conversion to a current is carried out once by a low impedance circuit, when a circuit must be designed only by the lateral PNP transistors, these lateral PNP transistors must be large due to a small current capacity.

Further, since a lateral PNP transistor has a small current amplification $h_{fe}$, a deviation of the current amplification $h_{fe}$ cannot be ignored and there is a possibility that a signal waveform may be distorted due to a phase dislocation occurred when an AC signal i changing in accordance with an image signal $V_i$ flows from an emitter to a collector.

SUMMARY OF THE INVENTION

In view of the foregoing, a first object of this invention is to provide a control circuit for signal level capable of automatically controlling a sync tip level and deviation only by a DC control signal without using an external resistor and without increasing the number of pins in a bipolar integrated circuit.

Another object of the invention is to provide a control circuit for signal level in which automatically controls a signal level to a desired signal level with a simple arrangement without being influenced by a dispersion of a current amplification $h_{fe}$ in a bipolar integrated circuit.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 1:
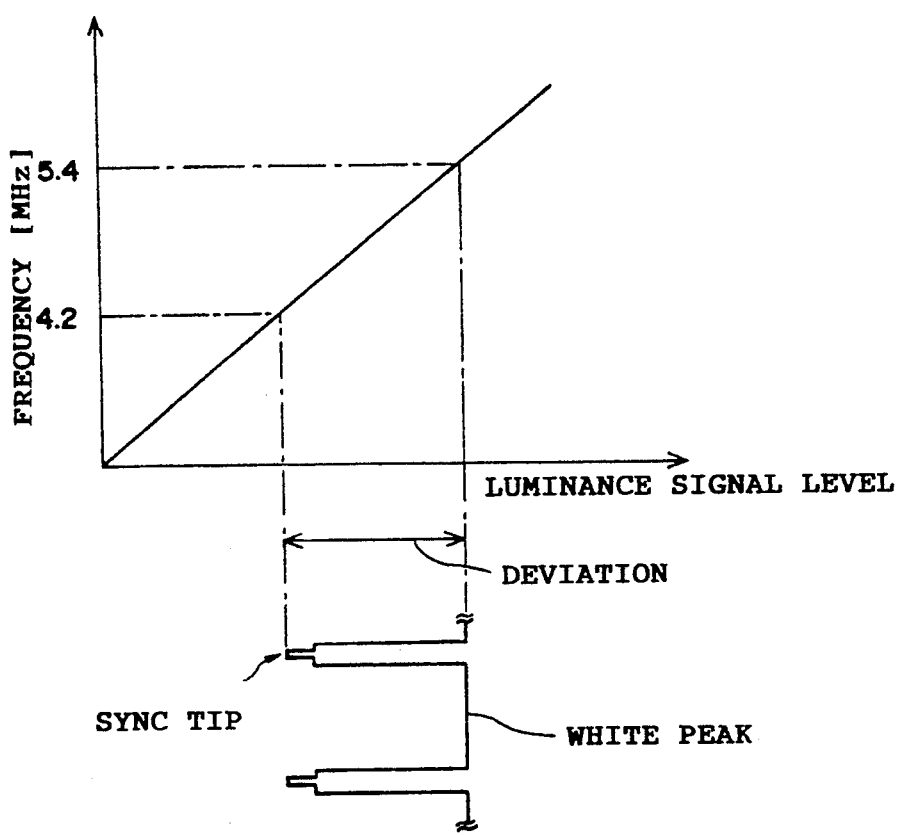
FIG. 1 is a waveform explaining a sync tip level and deviation.
Figure 2:
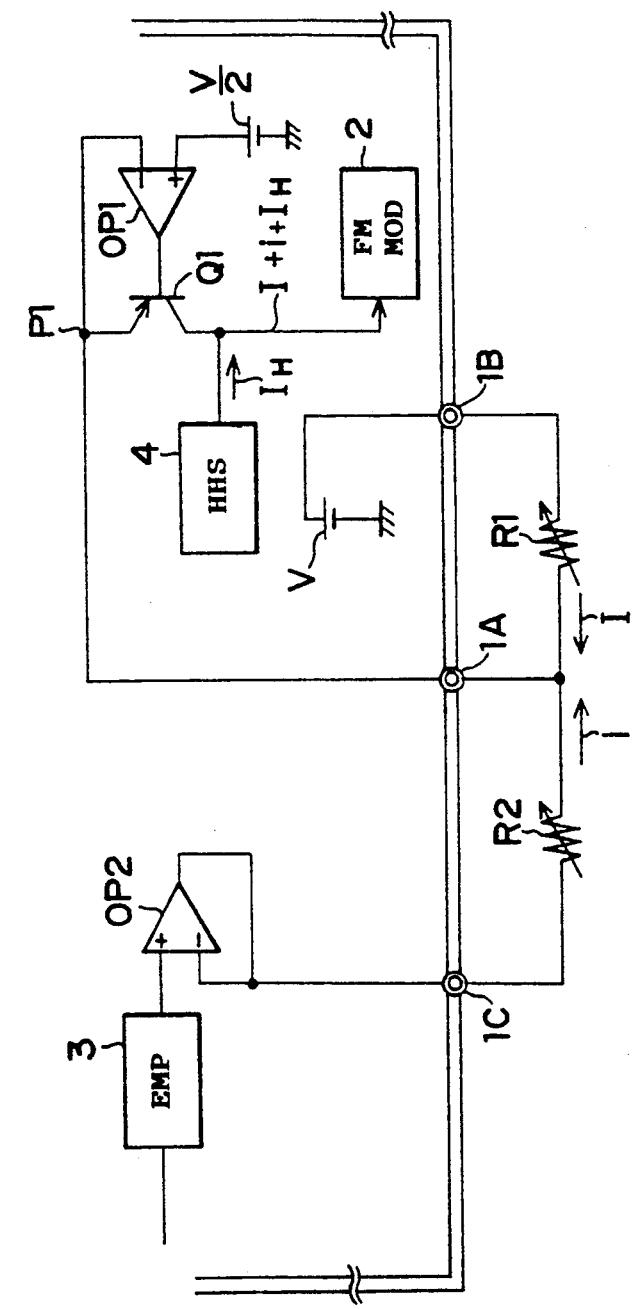
FIG. 2 is a wiring diagram explaining a first conventional carrier/deviation control circuit to be controlled manually.
Figure 3:
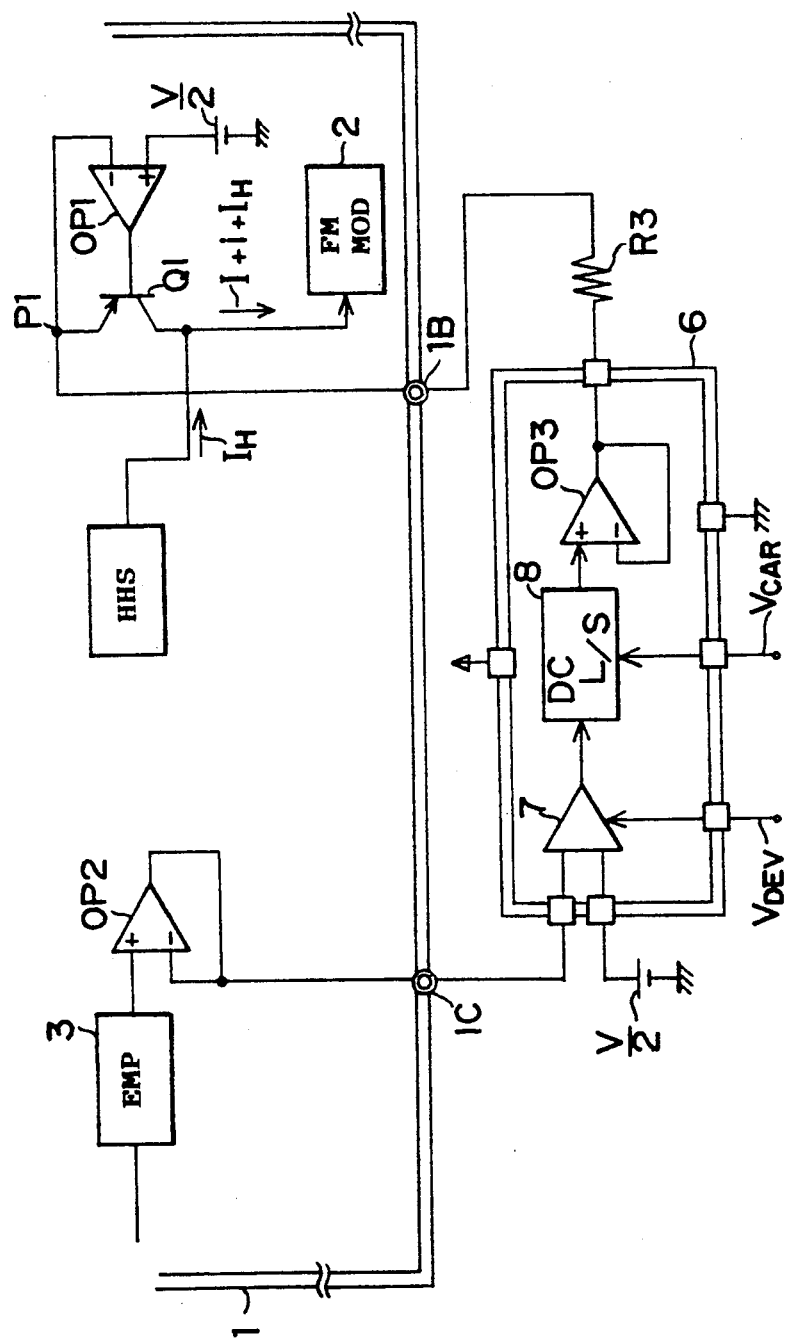
FIG. 3 is a wiring diagram of a second conventional carrier/deviation control circuit with 2 IC and 2 pins applicable to an electronic-volume control.
Figure 4:
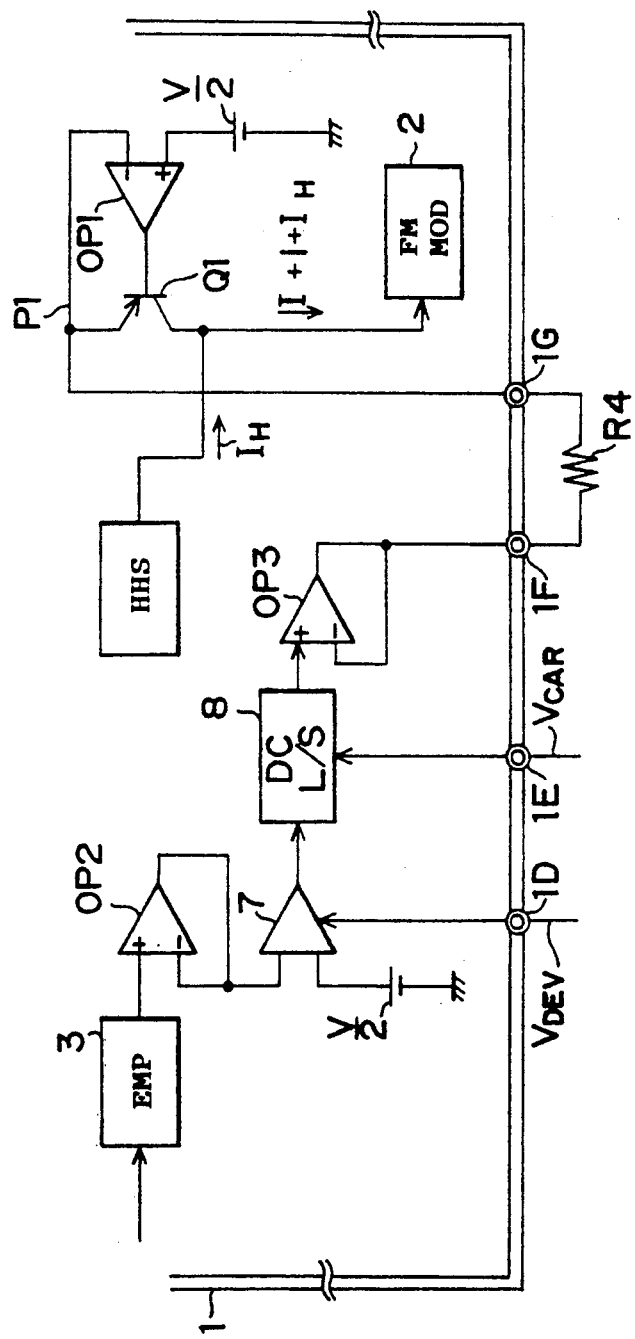
FIG. 4 is a wiring diagram of a third conventional carrier/deviation control circuit with a single IC and 4 pins applicable to an electronic-volume control.
Figure 5:
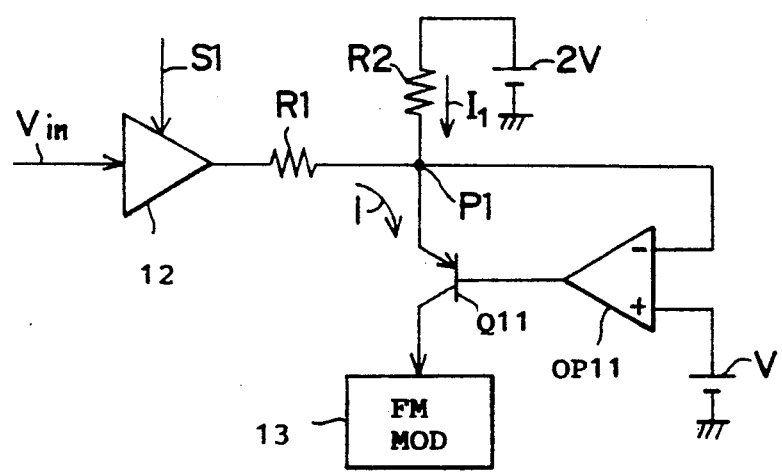
FIG. 5 is a wiring diagram explaining a fourth conventional control circuit for signal level.
Figure 6:
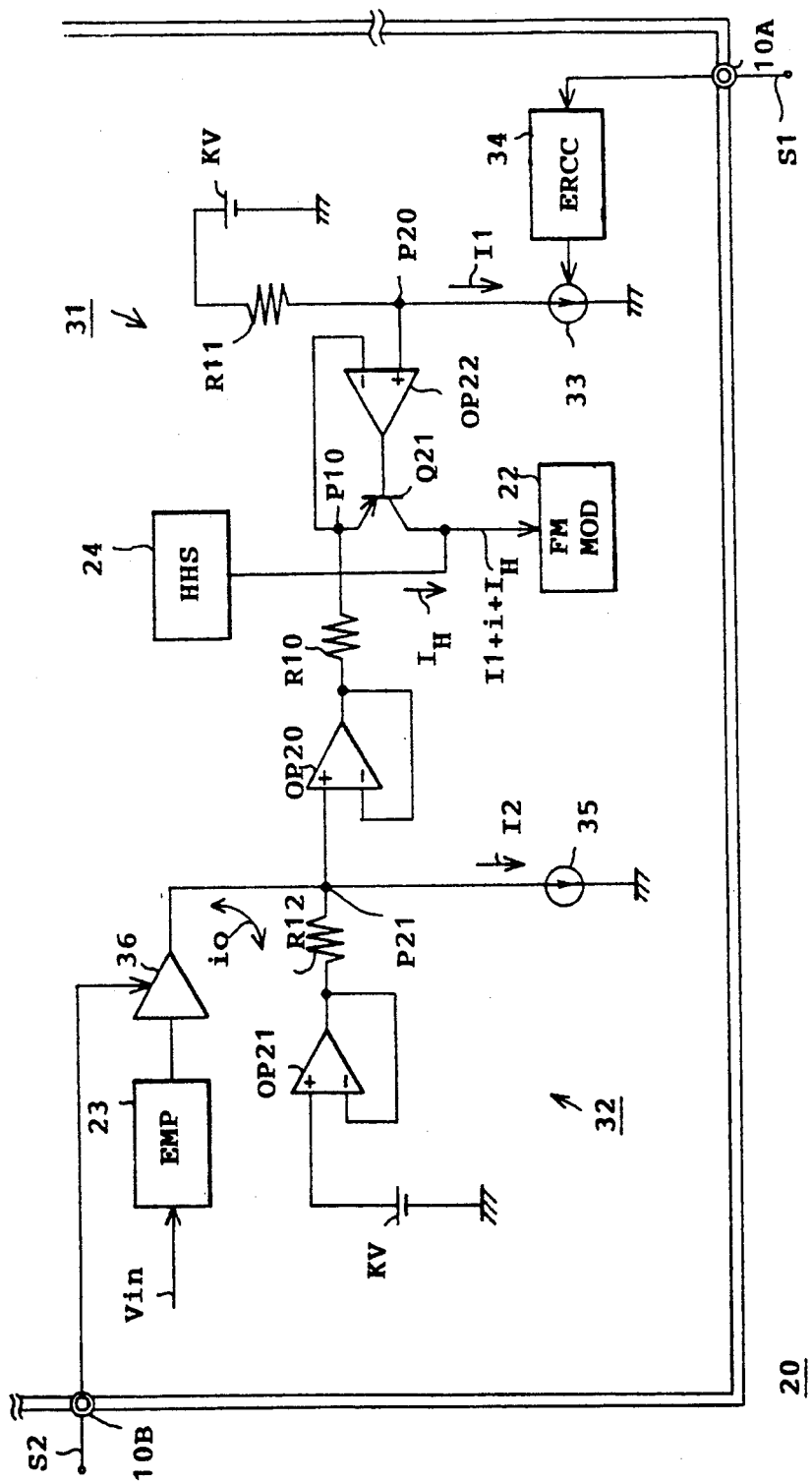
FIG. 6 is a wiring diagram of a carrier/deviation control circuit which is a first embodiment of the present invention.

Preferred embodiments of this invention will be described with reference to the accompanying drawings:

FIG. 6 illustrates a first preferred embodiment of the present invention.

In FIG. 6, 20 designates a carrier/deviation control circuit as a whole having a carrier control circuit portion 31 and deviation control circuit portion 32.

The carrier control circuit portion 31 has a PNP transistor Q21 and the base thereof is connected to the output terminal of an operational amplifier OP22 which is controlled by a voltage at a non-inverted input terminal.

The non-inverted input terminal of the operational amplifier OP22 is connected to the junction P20 at which a resistor R11 and constant current source 33 are connected; a predetermined external reference current I1 flows to the constant current source 33 from a predetermined reference voltage KV connected to the other end of the resistor R11, and thus a predetermined voltage V/2 is supplied to the junction P20.

An external reference current control circuit 34 controls the external reference current I1 flowing out to the constant current source 33 by a DC control signal S1 input through a sync tip level control pin 10A so as to control a DC current I for determining a sync tip level supplied to an FM modulation circuit 22.

Further, the output terminal of an operational amplifier OP20 arranged as a voltage follower is connected to the junction P10 at which the emitter of the transistor Q21 and the inverted input terminal are connected through a resistor R10 as an internal load and thus a DC current I1 without a temperature characteristic is supplied to the FM modulation circuit 22 through the transistor Q21 by a potential difference between the operational amplifier OP20 and the junction P10.

Further, the non-inverting input terminal of the operational amplifier OP20 is connected to the output terminal of an operational amplifier OP21 composed of a voltage follower, and thus the reference voltage KV, without a temperature characteristic, is supplied to the non-inverting terminal of the operational amplifier 21.

A constant current source 35 is connected to the junction P21 at which a resistor R12 and the operational amplifier OP20 are connected, and thus when an image signal is not input, an external reference current I2 flows out to the constant current source 35.

Further, the output stage of a voltage control amplifier 36 is connected to the junction P21, and thus an AC current i corresponding to an image signal $V_{in}$ input through an emphasis circuit 23 is supplied.

The voltage control amplifier 36 can control the AC current i by a DC control signal S2 input from a deviation control pin 10B so that the 100% white level of the image signal $V_{in}$ has a predetermined deviation.

In the above arrangement, when a carrier level of a current supplied to the FM modulation circuit 22 is controlled, the value of the DC current I1 is controlled in such a manner that the image signal $V_{in}$ is not input to the emphasis circuit 23 and a DC control signal S1 is input to the carrier level control pin 10A.

More specifically, when the image signal $V_{in}$ is not input, since the external reference current I2 entirely flows out to the constant current source 35 from the voltage control amplifier 36 and the AC current i does not flow to the resistor R12, the internal reference voltage KV applied to the noninverting input terminal of the operational amplifier OP21 composed of the voltage follower is supplied to the junction P21.

At this time, a potential V1 at the junction P20 of the carrier control circuit portion 31 is expressed by the following Equation (1) by using the reference voltage KV, external reference current I1 and the resistance R of the resistor R11 each not having a temperature characteristic due to an internal bias circuit.

$$V1 = KV - I1 \cdot [R[V] \qquad (1)$$

This potential V1 is applied to the junction P10 through the operational amplifier OP22 composed of the voltage follower so that a potential difference (KV−V1) is produced across the resistor R10 connected between the junction P10 and the operational amplifier P20.

As shown in the following Equation (2), a current I equal to the external reference current I1 is supplied to the FM modification circuit 22 from the resistor R10 through the transistor Q21.

$$\begin{aligned} I &= \frac{(KV - V1)}{R} \\ &= \frac{KV - (KV - I1 \cdot R)}{R} \\ &= I1 \, [\mu A] \end{aligned} \qquad (2)$$

At this time, since a external reference current I1 does not have the temperature characteric, the current I also does not have the temperature characteristic, and thus the current I supplied to the FM modification circuit 22 can be easily electronic-volume controlled by controlling the control signal S1 input to the sync tip level control terminal 10A.

When a deviation is controlled continuously, a gain of the image signal $V_{in}$ input to the voltage control amplifier 36 through the emphasis circuit 23 controlled by the DC control signal S2 input through the deviation control pin 10B.

An AC current $i_O$ superimposed on the external reference current I2 and flowing to the junction P21 in accordance with a change of the image signal $V_{in}$ flows to the resistor R12 and the AC voltage $i_O \cdot R_L$ without a temperature characteristic is produced at the junction P21 by the AC current $i_O$.

At this time, the AC voltage $KV + i_O \cdot R_L$ obtained by superimposing the AC voltage $i_O \cdot R_L$ on the reference voltage KV is applied to the output terminal of the operational amplifier OP20 and a current I shown by the following Equation (3) flows to the resistor R10.

$$I = \frac{KV + i_O \cdot R_L - (KV - I1 \cdot R)}{R} \quad (3)$$
$$= \frac{I1 \cdot R + i_O \cdot R_L}{R}$$
$$= I1 + i_O \cdot \frac{R_L}{R}$$
$$= I1 + i$$

Since the temperature characteristic of the resistances $R_L$ which is multiplied by the AC current $i_O$ in the second term can be assumed to be substantially equal to that of the resistance R, the AC current i including the external reference current I1 without a temperature characteristic can be supplied to the FM modulation circuit 22.

According to the above arrangement, the DC current I1 for setting a sync tip level can be controlled by the DC control signal S1 input through the carrier control pin 10A and the AC current i for setting a deviation can be controlled by the DC control signal S2 input through the deviation control pin 10B, and thus the carrier and deviation can be automatically controlled without increasing the number of pins.

Further, a metal film resistance conventionally connected to the outside of the IC for avoiding the fluctuation of the current I caused by the dispersed resistance and temperature fluctuation of the internal resistors is not needed and thus the carrier and deviation can be automatically controlled with a simpler arrangement.

Figure 7:
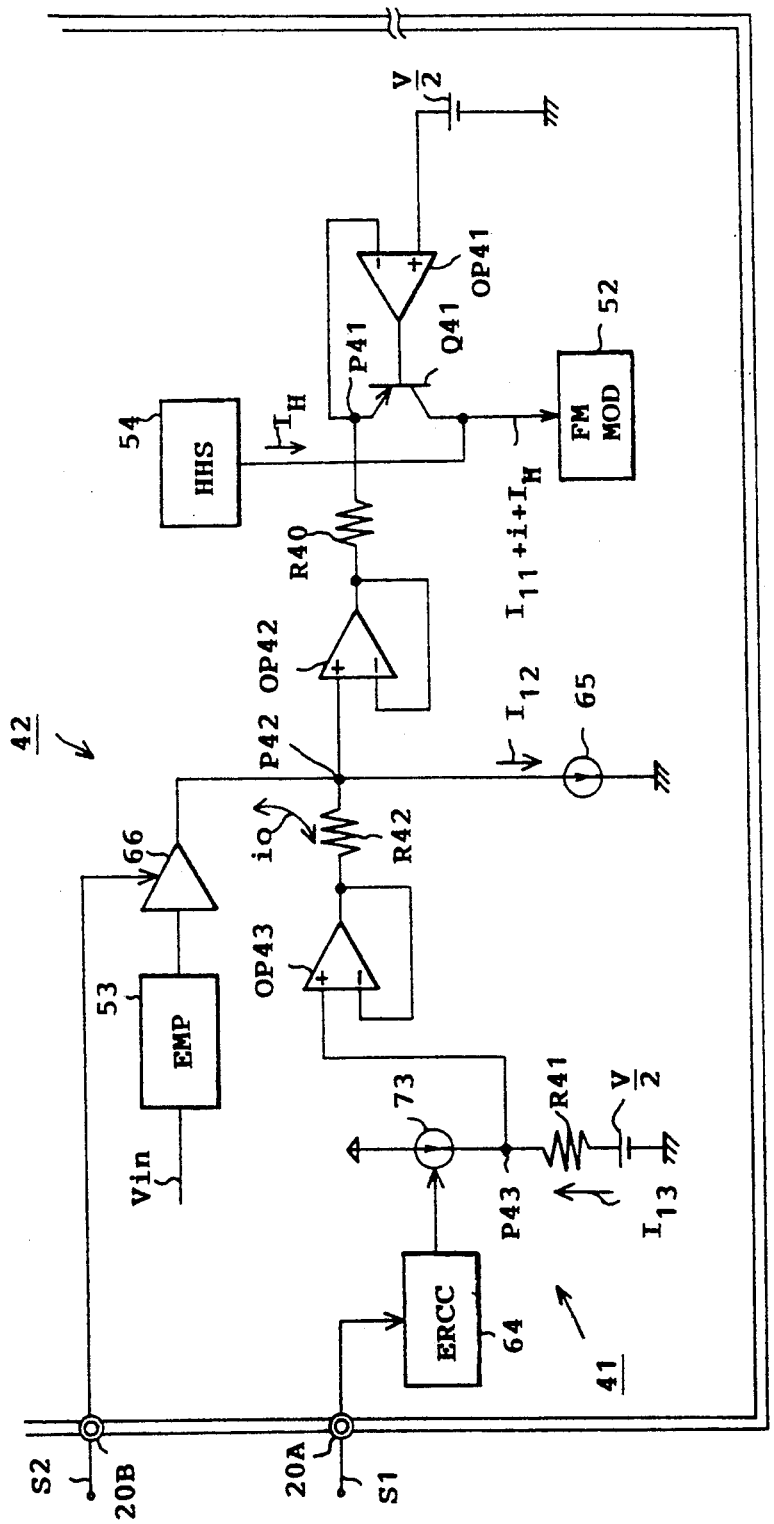
FIG. 7 is a wiring diagram of a carrier/deviation control circuit which is a second embodiment of the present invention.

FIG. 7 illustrates a second preferred embodiment of this invention.

In FIG. 7, a carrier/deviation control circuit 40 has the same arrangement as that shown in FIG. 6 except that a reference voltage V/2 is applied to the noninverting input terminal of an operational amplifier OP41 and the potential of the non-inverting terminal of an operational amplifier OP43 arranged as a voltage follower is controlled by a DC control signal S1 input from a carrier control pin 20A.

More specifically, the non-inverting input terminal of the operational amplifier OP43 is connected to the junction 43 at which a constant current source 73 and a resistor R41 are connected and the reference voltage V/2 is applied to the other end of the resistor R41.

A DC current I13 flowing to the constant current source 73 is controlled by the DC control signal S1 input from the carrier control pin 20A to an external reference current control circuit 64 and the potential $(V/2 + I13 \cdot R)$ applied to the junction P43 by the DC current I13 is supplied to the non-inverting input terminal of the operational amplifier OP43.

In the above arrangement, when a sync tip level is controlled, the external reference current I13 flowing to the constant current source 73 is controlled by the control signal S1 applied to the carrier control pin 20A to thereby control a current I supplied to an FM modulation circuit 52.

More specifically, the voltage $(V/2 + I13 \cdot R)$ is produced at the junction P43 by the external reference current I13 and supplied to the output terminal of an operational amplifier OP42 through the operational amplifier OP43 composed of the voltage follower and a resistor R42.

At this time, the constant current V/2 supplied to the non-inverting input terminal of the operational amplifier OP41 is impressed to the junction P41 at which a resistor R40 and the emitter of a transistor Q41 are connected so that a potential difference $I13 \cdot R$ $(= V/2 + I13 \cdot R - V/2)$ is produced across the resistor R40 connected between the junction P41 and the operational amplifier OP42.

As shown in the following Equation (4), a current I equal to the external reference current I13 flowing to the constant current source 73 is supplied to the FM modulation circuit 52 from the resistor R40 through the transistor Q41.

$$I = \frac{I13 \cdot R}{R} = I13 \quad (4)$$

With this arrangement, a sync tip level of an image signal $V_{in}$ supplied to the FM modulation circuit 52 can be controlled by the external reference current I13 flowing to the constant current source 73.

When a deviation is controlled continuously, an AC current $i_O$ superimposed on an external reference current I12 in accordance with a fluctuation of the image signal $V_{in}$ and supplied to a junction P42 flows to the resistor R42 so that a voltage obtained by superimposing the voltage $i_O \cdot R_L$ on the potential $(V/2 + I13 \cdot R)$ for setting the sync tip level is produced at the junction P42 by the AC current $i_O$.

Since a potential at the junction P41 is fixed to V/2 at this time, the potential difference $(I13 \cdot R + i_O R_L)$ is produced across the resistor R40, and a current I shown in the following Equation (5) is supplied to the FM modulation circuit 52 through the transistor Q41.

$$I = \frac{I13 \cdot R + i_O \cdot R_L}{R} \quad (5)$$
$$= I13 + i_O \cdot \frac{R_L}{R}$$
$$= I13 + i$$

It can be assumed here that resistance $R_L$ multiplied by the AC current $i_O$ in the second term has a temperature characteristic substantially similar to that of the resistance and thus these temperature characteristics can be cancelled, so that a current I obtained by superimposing the AC current i without a temperature characteristic on the external reference current I13 can be supplied to the FM modulation circuit 52.

According to the above arrangement, the temperature characteristic of the current I supplied to the FM modulation circuit 52 through the internal resistor R40 can be cancelled in such a manner that the reference voltage V/2 without a temperature characteristic is supplied to one end of the internal resistor R40 and the potential (V/2+I13·R) or (V/2+I13 R+i$_O$·R$_L$) obtained by superimposing the voltage I13·R determined by the product of the external reference current I13 and the internal resistance R or the voltage I13·R+i$_O$·R$_L$, which is obtained by superimposing the AC voltage i$_O$·R$_L$ varying in accordance with the image signal V$_{in}$ on the voltage I13·R, on the reference voltage V/2, and thus a carrier and deviation can be automatically controlled without the need for the conventionally used external resistor and an increase in the number of pins necessary for adjustment.

Although the above second embodiment describes the case in which the present invention is used in a carrier and deviation control circuit, the present invention is not limited thereto and widely applicable to the cases in which various signal levels are electronic-volume controlled to a predetermined voltage or current level.

Further, the above second embodiment describes the case in which a half H shift current is superimposed on the DC current I11 (I13) and AC current i, the present invention is not limited thereto and also applicable to the case in which the half H shift current is not superimposed.

As described above, according to the present invention, a current flowing to the internal resistor is not provided with a temperature characteristic and the first and second peak levels of an output signal can be easily and automatically controlled by a control signal in such a manner that a first reference potential without a temperature reference is supplied to one end of the internal resistor and a second reference potential obtained by the product of an external reference current and internal resistance is supplied to the other end thereof, whereby a signal control circuit with a simpler arrangement can be obtained.

Figure 8:
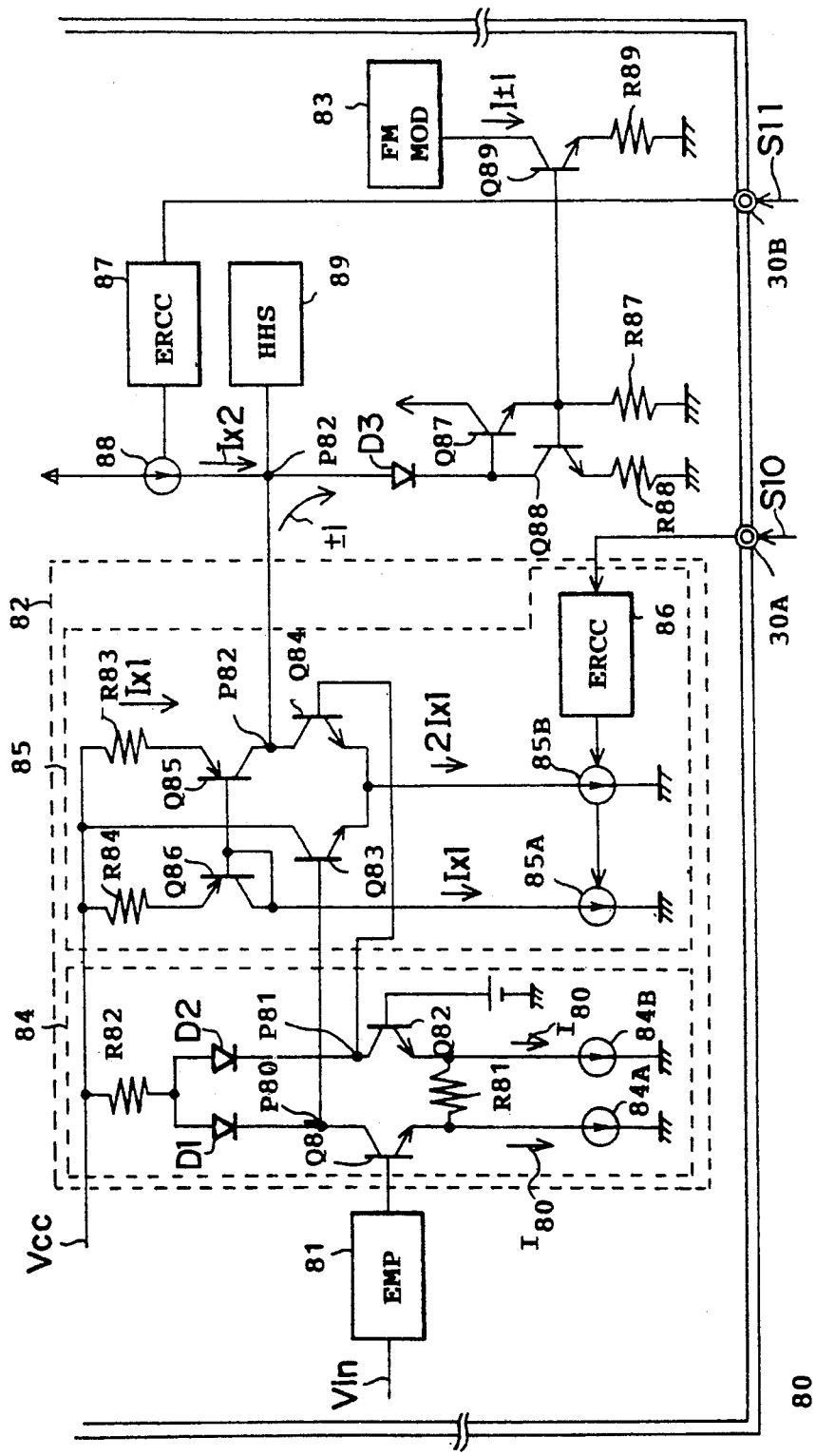
FIG. 8 is a wiring diagram of a control circuit for signal level of a carrier/deviation which is a third embodiment of the present invention.

FIG. 8 illustrates a third preferred embodiment of this invention.

In FIG. 8, 80 designates a carier/deviation control circuit as a whole, wherein a luminance signal V$_{in}$ input through an emphasis circuit 81 is converted into an AC current i by a Gilbert amplifier 82 and superimposed on a DC current I for controlling a sync tip level at a junction P82 and then supplied to an FM modulation circuit 83.

The Gilbert amplifier 82 is composed of a 2-staged differential amplifier composed of operational amplifiers 84 and 85. The differential amplification transistors Q81 and Q82 of the first operational amplifier 84 are composed of an NPN transistor and the emitters of the transistors Q81 and Q82 are connected together through a resistor R81.

The emitters of the transistors Q81 and Q82 are connected to constant current sources 84A and 84B, respectively, and supplied with a first reference current I80.

The collectors of the transistors Q81 and Q82 are connected to the anodes of diodes D1 and D2 and the cathodes of the diodes D1 and D2 are connected to a power supply V$_{CC}$ through a resistor R82.

The junctions P80 and P81 at which the collectors of the transistors Q81 and Q82 are connected to the diodes D1 and D2 are connected to the bases of the differential amplification transistors Q83 and Q84 of the second differential amplifier 85 so that an output in accordance with a potential difference between a reference voltage V$_{G1}$ and the luminance signal V$_{in}$ is supplied.

These transistors Q83 and Q84 are each of an NPN transistor and the emitters thereof are connected to a common constant current source 85B so that an external reference current 2I$_{X1}$ without a temperature dependency is supplied.

The collector of the transistor Q83 is supplied with the power supply voltage V$_{CC}$, the collector of the transistor Q84 is connected to the collector of the PNP transistor Q85, and an AC current i obtained by converting the luminance signal V$_{in}$ to a change of a current at the output from the junction P82 at which the transistors Q84 and Q85 are connected.

Transistors Q85 and Q86 constituting a current mirror circuit are connected to the power supply voltage V$_{CC}$ through resistors R83 and R84, the bases of the transistors Q85 and Q86 are connected together and the base of the transistor Q86 is connected to the collector thereof to form a diode connection.

The collector of the PNP transistor Q86 is connected to a constant current source 85A so that an external reference current I$_{X1}$ flows through the transistor Q86.

The external reference currents I$_{X1}$ and 2I$_{X1}$ flowing to the constant current sources 85A and 85B are controlled by an external reference current control circuit 86 through a DC control signal S10 input through a deviation control pin 30A.

The AC current i is supplied to the junction P82 at which a constant current source 88, controlled by an external reference current control circuit 87, is connected to a diode D3 and superimposed on an external reference current I$_{X2}$ flowing through the constant current source 88.

The base of an NPN transistor Q87 and the collector of a transistor Q88 each constituting a current mirror circuit are connected to the anode of the diode D3 respectively and the emitter of the transistor Q87 and the base of the transistor Q88 are connected together and grounded through a resistor R87.

Further, the emitter of the transistor Q88 is grounded through a resistor R88.

The base of the transistor Q88 is connected to the base of a transistor Q89, the emitter of the transistor Q89 is grounded through a resistor R89 and the transistor Q89 supplies an output luminance signal obtained by superimposing the AC current i on the DC current I to the FM modulation circuit 83.

Further, a half H shift current I$_h$ from a half H shift circuit 89 is superimposed at the junction P82, and thus the sync tip levels of control image signals are dislocated to remove crosstalk.

In the above arrangement, the image signal V$_{in}$ input from the emphasis circuit 81 is converted into the AC current i represented by $\pm i = g_m \cdot V_{in}$ by using the mutual conductance $g_m$ of the Gilbert amplifier 82 and output.

The mutual conductance $g_m$ is expressed by the following Equation (6) by using the resistance R of the internal resistor R81 and the emitter resistances $r_e$ and $r_{ex}$ of the first and second diferential amplifiers and 85.

$$g_m = \frac{r_e}{R + 2r_e} \cdot \frac{1}{r_{ex}} V_{in} \tag{6}$$

At this time, since the internal resistor R81 has a sufficiently large resistance with respect to the emitter resistance $r_e$, the AC signal $\pm i$ is expressed by the following Equation (7) by using Equation (6).

$$\pm i = g_m \cdot V_{in} \qquad (7)$$
$$= \frac{r_e}{R} \cdot \frac{1}{r_{ex}} V_{in}$$

In Equation (7), the emitter resistances $r_e$ and $r_{ex}$ are expressed by the following Equations (8) and (9) by using the external reference currents I and $I_{X1}$ and $V_T = kT/q$ (where k is a Boltzmann constant).

$$r_e = \frac{V_T}{I} \qquad (8)$$

and $$r_{ex} = \frac{V_T}{I_{X1}} \qquad (9)$$

When Equations (8) and (9) are substituted for Equation (7), the AC current i subjected to a current conversion by the Gilbert amplifier 82 is expressed by the following Equation (10).

$$i = \frac{1}{R} \cdot \frac{V_T}{I} \cdot \frac{V_T}{I_{X1}} \cdot V_{in} \qquad (10)$$

The reference current I is in inverse proportion to an internal resistance $R_{in}$ at the input stage and can be expressed as $V/R_{in}$, and further $V/R_{in}$ can be expressed as $k/R_{in}$ by using the Boltzmann constant k and thus when Equation (10) is modified, the AC current i is expressed by the following Equation (11).

$$i = \frac{R_{in}}{R} \cdot \frac{1}{k} \cdot I_{X1} \cdot V_{in} \qquad (11)$$

At this time, when a constant $R_{in}/R \cdot k$ is assumed to be a constant K, the constant K has no temperature characteristic as a whole because the temperature characteristic of the internal resistance $R_{in}$ is substantially equal to that of the internal resistance R and thus the temperature characteristic of the internal resistance $R_{in}$ is cancelled by the temperature characteristic of the internal resistance R.

As a result, since the AC current i output through the Gilbert amplifier 82 is expressed by the product of the constant K free of the temperature characteristic, external reference current $I_{X1}$ and input signal $V_{in}$, the AC current i can be obtained without the need for taking the dynamic range of the output stage into consideration and a deviation can be controlled by the external reference current $I_{X1}$.

With this arrangement, an output luminance signal $I \pm i$, which is obtained by superimposing at the junction P82 a carrier level signal composed of the DC current $I_{X2}$ controlled by and output from the carrier level controlling external reference current control circuit 87 for controlling a carrier level on a luminance signal component, is supplied to the FM modulation circuit 83 through the diode D3 and transistors Q87, Q88 and Q89.

According to the above arrangement, the voltage to current conversion gain of the luminance signal $V_{in}$ input to the Gilbert amplifier 82 can be controlled by the DC control signal S10 input from the deviation control pin 30A, and a carrier and deviation can be easily and automatically controlled through each of the carrier control pin 30B and deviation control pin 30A in such a manner that a current is added to the carrier DC current $I_{X2}$ controlled by the DC control signal S11 input from the carrier control pin 10B.

Note, although the aforesaid third embodiment describes the case in which a voltage change of a luminance signal is converted to the AC current i by the Gilbert amplifier 82 to thereby control a white peak level, the present invention is not limited thereto and can be widely applicable to the case in which a voltage change is converted into a current change to thereby control a current level to a predetermined level.

As described above, according to the present invention, a control circuit for signal level excellent in phase characteristics can be realized by a simple arrangement in such a manner that a first external reference current without a temperature dependency is supplied to the output stage of a voltage to current conversion circuit composed of 2-staged differential amplifier and converts the same to an AC current obtained by the product of the external reference current and an input signal and adds the current to a DC current composed of a second external reference current.

What is claimed is:

1. A signal level control circuit for controlling the first and second peak levels of an output signal supplied to a signal processing circuit through a load resistor to a desired signal level by controlling first and second reference potentials impressed across said load resistor, comprising:

a first reference potential control means for controlling said first reference potential by connecting one end of said load resistor to the junction at which a first internal resistor and a first constant current source are connected and controlling a first external reference current flowing from said internal resistor to said constant current source; and a second reference potential control means for controlling said second reference potential by connecting the other end of said load resistor to the junction at which a second internal resistor and a second constant current source are connected and superimposing said other end on a second reference current flowing to said second constant current source to thereby control a gain of an AC current flowing to said second internal resistor.

2. The signal level control circuit according to claim 1, wherein the other end of said second internal resistor is connected to said first internal resistor and a first constant current source and the other end of said load resistor is fixed to a predetermined potential.

3. A signal level control circuit for controlling an output signal level to a desired signal level by controlling a level of a DC current and a level of a gain by first and second external control signal, comprising:

a DC current level control means for controlling the level of said DC current level flowing from a first current source by said first external control signal;

a first differential amplifier circuit connected to second current sources for amplifying an input signal and outputting the same to the next stage;

a second differential amplifier circuit connected to third current sources for performing a conversion to an AC current without a temperature characteristic in accordance with a differential output supplied from said first differential amplifier circuit; and a gain control means for controlling the gain of an AC current output from said second differential amplifier means by controlling currents flowing from said third current sources by said second external control signal.

* * * * *